(12) United States Patent
Banerjee et al.

(10) Patent No.: US 10,248,351 B1
(45) Date of Patent: Apr. 2, 2019

(54) SET TECHNIQUE FOR PHASE CHANGE MEMORY

(71) Applicant: INTEL CORPORATION, Santa Clara, CA (US)

(72) Inventors: Koushik Banerjee, Milpitas, CA (US); Lu Liu, Boise, ID (US); Sanjay Rangan, Boise, ID (US); Enrico Varesi, Santa Clara, CA (US); Innocenzo Tortorelli, Santa Clara, CA (US); Hongmei Wang, Santa Clara, CA (US); Mattia Boniardi, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,388

(22) Filed: Sep. 29, 2017

(51) Int. Cl.
| | |
|---|---|
| *G06F 12/00* | (2006.01) |
| *G06F 3/06* | (2006.01) |
| *G11C 13/00* | (2006.01) |
| *G06F 12/02* | (2006.01) |

(52) U.S. Cl.
CPC .......... *G06F 3/0634* (2013.01); *G06F 3/0604* (2013.01); *G06F 3/0679* (2013.01); *G06F 12/02* (2013.01); *G06F 12/0238* (2013.01); *G11C 13/0004* (2013.01); *G11C 13/0023* (2013.01)

(58) Field of Classification Search
CPC .... G06F 3/0634; G06F 3/0604; G06F 3/0679; G06F 12/02; G06F 12/0238; G11C 13/0004; G11C 13/0023
See application file for complete search history.

(56) References Cited

U.S. PATENT DOCUMENTS

2008/0025076 A1* 1/2008 Scheuerlein ............. G11C 5/02
365/163

\* cited by examiner

*Primary Examiner* — Shawn X Gu
(74) *Attorney, Agent, or Firm* — Grossman, Tucker, Perreault & Pfleger, PLLC

(57) ABSTRACT

One embodiment provides a memory controller. The memory controller includes a memory controller circuitry and a set pulse determination circuitry. The memory controller circuitry is to identify an address of a target memory cell to be set. The set pulse determination circuitry is to select a positive polarity set pulse if the target memory cell is included in a positive polarity deck or to select a negative polarity set pulse if the target memory cell is included in a negative polarity deck. Each set pulse includes a respective nucleation portion and a respective growth portion. Each portion has a respective current amplitude and a respective time duration.

24 Claims, 3 Drawing Sheets

2
SET TECHNIQUE FOR PHASE CHANGE MEMORY

FIELD

The present disclosure relates to phase change memory, in particular to, a set technique for phase change memory.

BACKGROUND

Phase change memory is a memory device which typically uses a chalcogenide material for the memory elements. In operation, the phase change memory stores information on the memory element by changing the phase of the memory element between amorphous and crystalline phases. Generally, the amorphous phase has a low conductivity and is associated with a reset state and the crystalline phase has a high conductivity and is associated with a set state. Material phase transitions may be induced by electrically heating the phase change materials by applying a current that flows through a target memory cell. Joule heating may then induce a phase change transition, from the crystalline state to the amorphous state or from the amorphous state to the crystalline state.

Phase change memory cells may be arranged in a three-dimensional cross-point memory array including a first group of address lines and a second group of address lines. The first group of address lines corresponds to word lines (WLs) and the second group of address lines corresponds to bit lines (BLs). The WLs and BLs cross and each memory cell is coupled between a WL and a BL where the WL and BL cross (i.e., cross-point).

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
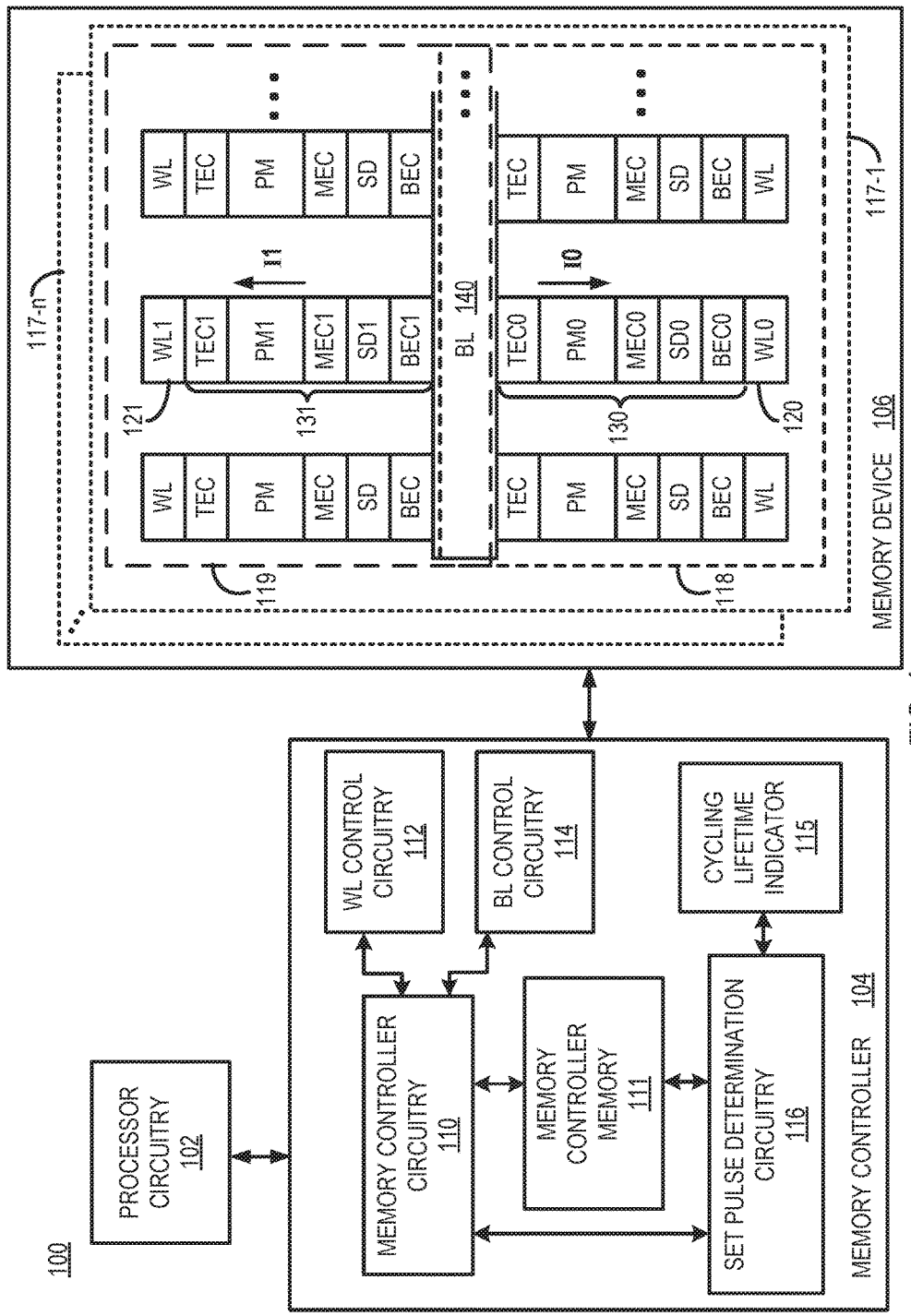
FIG. 1 illustrates a functional block diagram of a phase change memory system consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

A memory device may include a plurality of decks arranged in pairs. Each pair of decks may include a positive polarity deck and a negative polarity deck. Each deck may include a memory array. Each memory array includes a plurality of memory cells positioned between a plurality of word lines and a plurality of bit lines. The plurality of bit lines may be common to the positive polarity deck and negative polarity deck that are included in a respective pair. The negative polarity deck may be positioned above the positive polarity deck and the positive polarity deck may be positioned above a substrate. As used herein, "positive polarity" corresponds to a cathode (negative electrode) positioned closer to the substrate than a corresponding anode (positive electrode) and "negative polarity" corresponds to an anode (positive electrode) positioned closer to the substrate than a corresponding cathode (negative electrode).

A selected memory cell may be set by applying a set pulse to the selected memory cell. The set pulse is configured to change the state of the selected memory cell from amorphous to crystalline. Each set pulse has a set pulse time duration, Tset. The set pulse time duration includes two intervals: a nucleation portion and a growth portion. Each portion has a respective current amplitude and respective time duration. Generally, due to crystallization kinetics, the nucleation portion has a relatively longer time duration and a relatively lower current amplitude compared to the growth portion.

A direction of current flow through the selected memory cell is related to whether the selected memory cell is included in the positive polarity deck or the negative polarity deck. The shared BLs are considered positive relative to the respective WLs of each deck. The direction of current flow further affects optimum set pulse parameters for the target memory cell, as will be described in more detail below. Thus, an optimum positive polarity set pulse differs from an optimum negative polarity set pulse. In other words, respective optimum current amplitudes and respective time durations of the nucleation portions and growth portions of the positive polarity set pulses and the negative polarity set pulses differ.

Generally, this disclosure relates to a set technique for phase change memory. An apparatus, method and/or system are configured to identify an address of a target memory cell to be set. The apparatus, method and/or system are further configured to select a positive polarity set pulse if the target memory cell is included in a positive polarity deck or a negative polarity set pulse if the target memory cell is included in a negative polarity deck. Each set pulse is configured to include a respective nucleation portion and a respective growth portion, each portion having a respective current amplitude and a respective time duration.

In an embodiment, the growth portion may include a plurality of growth subportions. In one nonlimiting example, the number of growth subportions may be equal to two. Each growth subportion may have a respective growth subportion current amplitude and a respective growth subportion time duration. For example, a first growth subportion may have a relatively higher subportion current amplitude and a relatively shorter subportion duration compared to a second growth subportion. The plurality of growth subportions is configured to shorten an overall duration of the growth portion compared to a growth portion without subportions. Shortening the duration of the growth subportion may then correspond to a relatively shorter set pulse duration and, thus, a relatively faster set operation.

In an embodiment, an apparatus, method and/or system may be configured to adjust one or more selected set pulse parameters during a cycling lifetime of a plurality of memory cells included in a selected deck included in a memory device. Set pulse parameters for a positive polarity set pulse and/or a negative polarity set pulse may include, but are not limited to, a nucleation portion current amplitude, a nucleation portion duration, a growth portion current amplitude, a growth portion duration, a growth subportion current amplitude and/or a growth subportion time duration. The set pulse parameter(s) of the negative polarity set pulse may be adjusted independent of adjustments (if any) to the set pulse parameter(s) of the positive polarity set pulse. In one nonlimiting example, the respective amount a selected set pulse parameter is adjusted may be related to a number of cycles, i.e., a cycling lifetime, of the corresponding deck.

Thus, a set pulse and corresponding set pulse parameters may be selected for a target memory cell based, at least in part, on whether the target memory cell is included in the positive polarity deck or the negative polarity deck.

FIG. 1 illustrates a functional block diagram of a phase change memory system 100 consistent with several embodiments of the present disclosure. Phase change memory system 100 may correspond to, and/or be included in, a mobile telephone including, but not limited to a smart phone (e.g., iPhone®, Android®-based phone, Blackberry®, Symbian®-based phone, Palm®-based phone, etc.); a wearable device (e.g., wearable computer, "smart" watches, smart glasses, smart clothing, etc.) and/or system; a computing system (e.g., a server, a workstation computer, a desktop computer, a laptop computer, a tablet computer (e.g., iPad®, GalaxyTab® and the like), an ultraportable computer, an ultramobile computer, a netbook computer and/or a subnotebook computer; etc.

Phase change memory system 100 includes a processor circuitry 102, a memory controller 104 and a memory device 106. For example, processor circuitry 102 may correspond to a single core or a multi-core general purpose processor, such as those provided by Intel® Corp., etc. Memory controller 104 may be coupled to and/or included in processor circuitry 102 and is configured to couple processor circuitry 102 to memory device 106. Memory device 106 includes a plurality of memory cells that may correspond to three-dimensional cross-point memory technology. Each memory cell may include a memory element that includes a phase change material.

Processor circuitry 102 may be configured to provide a memory access request, e.g., a write request, to memory controller 104. For example, the write request may include address information and data to be written to a memory location in memory device 106 that corresponds to the address information. The data may include at least one set bit. The memory controller 104 may then be configured to manage writing the data to the memory device 106 and setting at least one memory element that corresponds to the at least one set bit.

In the following description, it is assumed that at least one bit is set in data associated with a write request from processor circuitry 102 to memory controller 104.

Memory controller 104 includes a memory controller circuitry 110, a memory controller memory 111, a word line (WL) controller circuitry 112, a bit line (BL) controller circuitry 114 and a set pulse determination circuitry 116. The memory controller circuitry 110 is configured to determine an address of a target memory cell in response to a write request from processor circuitry 102. The memory controller circuitry 110 is configured to identify a corresponding WL and a corresponding BL based, at least in part, on the determined address. The memory controller circuitry 110 is further configured to control the WL control circuitry 112 and the BL control circuitry 114 to select the target memory cell(s). The WL control circuitry 112 and BL control circuitry 114 are then configured to apply appropriate programming pulse(s) to set or reset the selected target memory cell(s). Memory controller memory 111 is configured to store one or more set pulse parameters and may be configured to store a cycling lifetime indicator, as will be described in more detail below.

Memory device 106 includes a plurality pairs of decks 117-1, . . . , 117-n. Each pair, e.g., pair 117-1, includes a positive polarity deck, e.g., positive polarity deck 118, and a negative polarity deck, e.g., negative polarity deck 119. Positive polarity deck 118 includes a plurality of WLs, e.g., WL0, and negative polarity deck 119 includes a plurality of WLs, e.g., WL1. The positive polarity deck 118 and negative polarity deck 119 share a plurality of common BLs, e.g., BL 140.

Each deck includes a plurality of memory cells positioned between the plurality of WLs and the plurality of BLs. For example, positive polarity deck 118 includes a plurality of lower memory cells, e.g., lower memory cell 130 positioned between WL0 and BL 140. In another example, negative polarity deck 119 includes a plurality of upper memory cells, e.g., upper memory cell 131 position between WL1 and BL 140. The positive polarity deck 118 that contains memory cells positioned below BL 140 may be termed a lower deck. The negative polarity deck 119 that contains memory cells positioned above BL 140 may be termed an upper deck. "Upper" and "lower" correspond to relative position of the decks, with lower being relatively closer to a substrate, and do not necessarily represent relative orientation in space.

Each memory cell includes a plurality of layers. For example, each lower memory cell, e.g., lower memory cell 130, starting adjacent WL0, includes a bottom electrical contact BEC0, a select device SD0, a middle electrical contact MEC0, a memory element PM0 and a top electrical contact TEC0. The top electrical contact TEC0 is adjacent BL 140. Similarly, each upper memory cell, e.g., upper memory cell 131, starting adjacent BL 140, includes a bottom electrical contact BEC1, a select device SD1, a middle electrical contact MEC1, a memory element PM1 and a top electrical contact TEC1. The bottom electrical contact BEC1 is adjacent BL 140.

Each select device, e.g., select device SD0 or SD1, is configured to facilitate selecting a target memory cell. Thus, select devices may include, but are not limited to, transistors, diodes, etc. Each memory element PM0, PM1 corresponds to a phase change element having an amorphous phase and a crystalline phase. Each memory element is thus configured to store data, e.g., a logical zero (reset, amorphous phase) and/or a logical one (set, crystalline phase).

Lower memory cell 130 may be set by applying a positive polarity set pulse to the lower memory cell 130. Arrow I0 corresponds to the positive polarity set pulse positive current flow. In other words, BL 140 and TEC0 correspond to an anode for memory element PM0, WL0 corresponds to a cathode for memory element PM0 and WL0 is positioned closer to a substrate than BL 140 and TEC0. Thus, I0 corresponds to a positive polarity set pulse.

Similarly, upper memory cell 131 may be set by applying a negative polarity set pulse to the upper memory cell 131. Arrow I1 corresponds to the negative polarity set pulse positive current flow. In other words, BL 140 and BEC1 correspond to an anode for memory element PM1, WL1 corresponds to a cathode for memory element PM1 and WL1 is positioned more distant from the substrate than BL 140 and BEC1. Thus, I1 corresponds to a negative polarity set pulse.

Each set pulse corresponds to a current pulse having a nucleation portion and a growth portion. Each portion has an associated current amplitude and an associated duration. The current amplitudes and durations differ between the positive polarity set pulse and the negative polarity set pulse.

A set operation (i.e., application of a set pulse to a target memory cell) is configured to result in a corresponding memory element PM0 or PM1, being in a crystalline state. Crystallization may generally be achieved by application of a set pulse that includes a nucleation portion followed by a growth portion, as described herein. It may be appreciated that the respective polarities of the decks 118, 119 and the chemical composition of the memory elements PM0, PM1 affect a respective response of each memory element to the respective applied set pulse.

Each memory cell 130, 131 may experience a respective thermal profile and corresponding temperature gradient during a set operation. The upper portion of each memory element PM0, PM1, i.e., adjacent TEC0, TEC1, respectively, is relatively cooler compared to the lower portion of each memory element, i.e., adjacent MEC0, MEC1, respectively. A relatively higher temperature may facilitate both nucleation and growth and a relatively lower temperature may inhibit nucleation and/or growth. Thus, during a set operation, a memory cell included in a positive polarity deck, e.g., lower memory cell 130 included in positive polarity deck 118, may experience inhibited nucleation and enhanced growth and a memory cell included in a negative polarity deck, e.g., upper memory cell 131 included in negative polarity deck 119, may experience enhanced nucleation and inhibited growth. Thus, set pulse parameters of an optimum set pulse may differ for memory cells included in the positive polarity deck 118 versus memory cells included in the negative polarity deck 119.

In an embodiment, set pulse determination circuitry 116 may be configured to determine whether a target memory cell to be set is included in positive polarity deck 118 or negative polarity deck 119. Set pulse determination circuitry 116 may then be configured to select a positive polarity set pulse if the target memory cell is included in the positive polarity deck 118 or to select a negative polarity set pulse if the target memory cell is included in the negative polarity deck 119. The positive polarity set pulse and the negative polarity set pulse may be configured to accommodate variation in nucleation and/or growth related to whether the target memory cell is included in the positive polarity deck or the negative polarity deck, as described herein.

Figure 2:
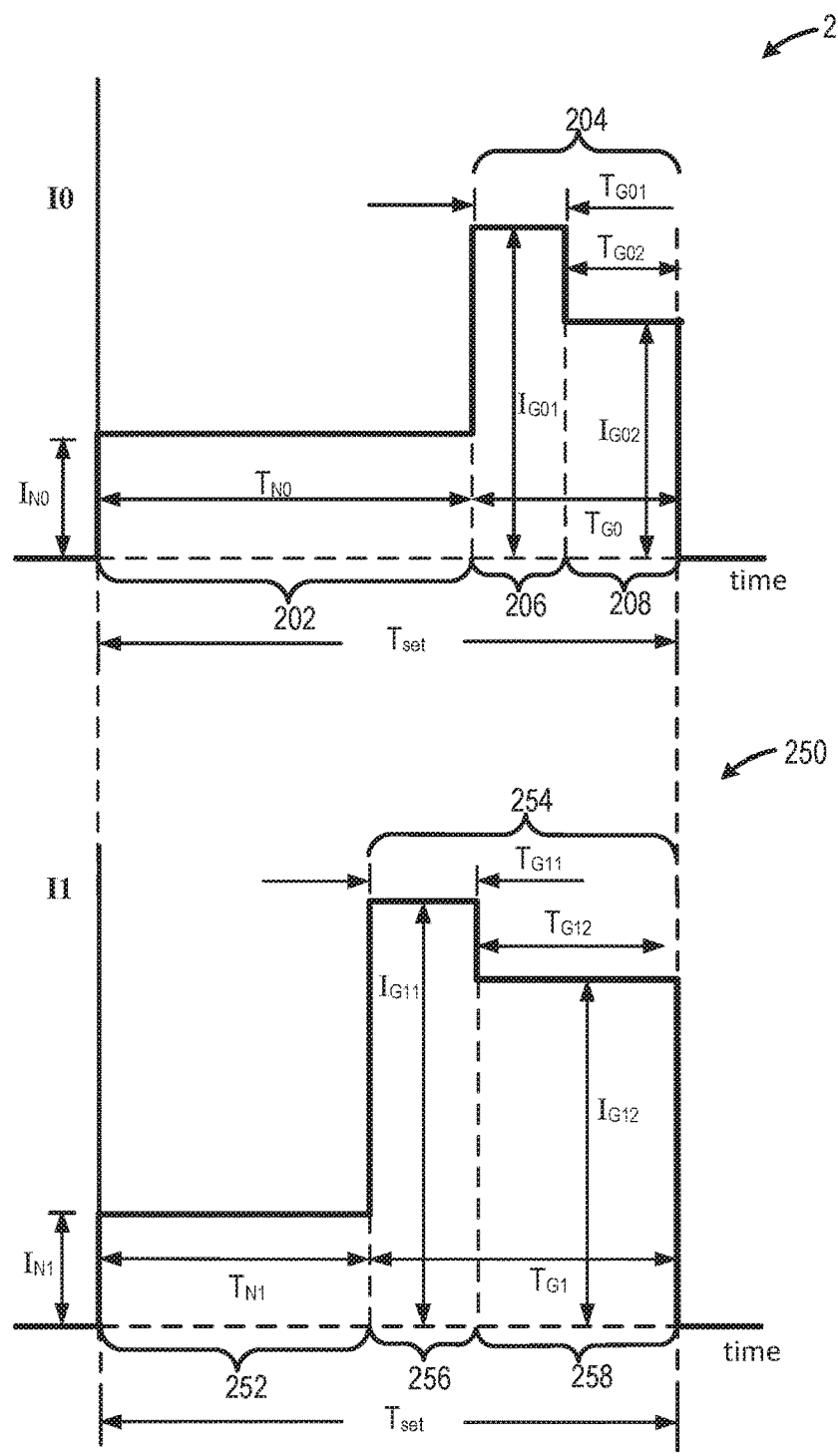
FIG. 2 illustrates a positive polarity set pulse and a negative polarity set pulse, consistent with several embodiments of the present disclosure.

FIG. 2 illustrates a positive polarity set pulse 200 and a negative polarity set pulse 250, respectively, consistent with several embodiments of the present disclosure. The horizontal axis corresponds to time and the vertical axis corresponds to set pulse current amplitude for each set pulse 200, 250. The positive polarity set pulse 200 has a current I0 as a function of time and the negative polarity set pulse has a current I1 as a function of time.

Each set pulse 200, 250 has a set pulse duration, Tset. In an embodiment, the set pulse duration is the same for the positive polarity set pulse 200 and the negative polarity set pulse 250. In one nonlimiting example, the set pulse duration, Tset, may be in the range of 100 nano second (ns) to 1200 ns.

Each set pulse 200, 250 has a respective nucleation portion 202, 252, and a respective growth portion 204, 254. Each growth portion 204, 254 may include one or more subportions, e.g., subportions 206, 208 and subportions 256, 258, respectively. Although growth portions 204, 254 each include two subportions, the present disclosure is not limited in this regard. In other words, a growth portion may include two subportions, more than two subportions or may not include subportions (i.e., the respective growth portion current amplitude may be constant for the entire growth portion 204, 254 duration), consistent with the present disclosure.

A set pulse with plurality of growth subportions may have a relatively shorter set pulse duration compared to a set pulse with a single growth portion, i.e., without growth subportions. For example, for a growth portion that includes two subportions, a first subportion may have a relatively higher current amplitude and a relatively shorter duration than a second subportion. It may be appreciated that a growth portion may have two regimes corresponding to the two subportions. A first regime may be relatively fast with a relatively short duration, for example, 5 nanoseconds (ns) to 10 ns. The first regime may have a relatively high current, for example, 60 microamperes (uA) to 80 uA. The relatively high current is configured to provide a relatively high temperature which facilitates the relatively higher speed. Thus, the first portion may be relatively high current and have a relatively short duration. The relatively high temperature of the first regime may then facilitate reducing a duration of a second regime. The second regime may be relatively longer duration, for example, 30 ns to 100 ns. The second regime may have an optimum current, for example, 40 uA to 60 uA. Thus, the second portion may have an optimum current and have a relatively longer duration compared to the first portion. The two regimes may then be accommodated by the two subportions.

Each portion (nucleation, growth) and/or subportion (growth) has a respective time duration and a respective current amplitude. The nucleation portion 202 of the positive polarity set pulse 200 has time duration $T_{N0}$ and a current amplitude $I_{N0}$. The growth portion 204 of the positive polarity set pulse 200 has time duration $T_{G0}$. The growth portion 204 includes two subportions 206, 208. A first subportion 206 has a time duration $T_{G01}$ and a current amplitude $I_{G01}$ and a second subportion 208 has a time duration $T_{G02}$ and the current amplitude $I_{G02}$.

The nucleation portion 252 of the negative polarity set pulse 251 has time duration $T_{N1}$ and a current amplitude $I_{N1}$. The growth portion 254 of the negative polarity set pulse 250 has time duration $T_{G1}$. The growth portion 254 includes two subportions 256, 258. A first subportion 256 has a time duration $T_{G11}$ and a current amplitude $I_{G11}$ and a second subportion 258 has a time duration $T_{G12}$ and the current amplitude $I_{G12}$.

The time durations and/or current amplitudes may be selected and/or adjusted to optimize set operation performance for memory cells included in a positive polarity deck, e.g., positive polarity deck 118, and memory cells included in a negative polarity deck, e.g., negative polarity deck 119. The current amplitudes and/or time durations of positive polarity set pulse 200 may be selected independent of the current amplitudes and/or time durations of negative polarity set pulse 250. Thus, the effects of the thermal profiles on nucleation and/or growth for lower memory cells (included in the positive polarity deck) and upper memory cells (included in the negative polarity deck) during set operations may be accommodated.

In an embodiment, the set pulse duration, Tset, may be maintained constant. Thus, an increase in the time duration of a respective nucleation portion ("nucleation portion duration"), $T_{N0}$, $T_{N1}$, may be offset by a corresponding decrease in the time duration of a respective growth portion ("growth portion duration"), $T_{G0}$, $T_{G1}$.

In an embodiment, the nucleation portion duration of the positive polarity set pulse, $T_{N0}$, may be greater than the nucleation portion duration of the negative polarity set pulse, $T_{N1}$. In an embodiment, the growth portion duration of the positive polarity set pulse, $T_{G0}$, may be less than the growth portion duration of the negative polarity set pulse, $T_{G1}$. The relative durations are configured to accommodate the differing effects of the thermal profile on the lower memory cells and the upper memory cells.

In an embodiment, a growth portion current amplitude of the positive polarity set pulse may be less than a corresponding growth portion current amplitude of the negative polarity set pulse. In an embodiment, a growth subportion current amplitude of the positive polarity set pulse may be less than a corresponding growth subportion current amplitude of the negative polarity set pulse. For example, $I_{G01}$ may be less than $I_{G11}$. In another example, $I_{G02}$ may be less than $I_{G12}$.

In one nonlimiting example, $T_{N0}$ may be in the range 150 ns to 700 ns, $I_{N0}$ may be in the range 15 uA to 25 uA and $T_{G0}$ may be in the range 25 ns to 70 ns. In another nonlimiting example, $T_{G11}$ may be in the range 5 ns to 15 ns, $I_{G11}$ may be in the range 50 uA to 60 uA, $T_{G02}$ may be in the range 20 ns to 50 ns and $I_{G02}$ may be in the range 40 uA to 50 uA.

In one nonlimiting example, $T_{N1}$ may be in the range 100 ns to 500 ns, $I_{N1}$ may be in the range 15 uA to 30 uA and $T_{G1}$ may be in the range 35 ns to 115 ns. In another nonlimiting example, $T_{G11}$ may be in the range 5 ns to 15 ns, $I_{G11}$ may be in the range 70 uA to 80 uA, $T_{G12}$ may be in the range 30 ns to 100 ns and $I_{G12}$ may be in the range 60 uA to 70 uA.

Turning again to FIG. 1, memory controller 104 and memory controller circuitry 110 and set pulse determination circuitry 116 may be configured to determine one or more set pulse parameters and to store the set pulse parameters in memory controller memory 111. In one nonlimiting example, memory controller memory 111 may correspond to programmable hardware, e.g., a field programmable gate array (FPGA), programmable logic device (PLD), programmable array logic (PAL), etc.

One or more set pulse parameter(s) may be trimmed to a respective optimized value from a nominal value during manufacturing, for example as part of post-fabrication testing. The set pulse parameter(s) may be trimmed per deck, e.g., per positive polarity deck 118 and per negative polarity deck 119, and per die. With the exception of the set pulse duration, Tset, that may be the same for both the positive polarity deck and negative polarity deck of a deck pair, the set pulse parameter(s) may be trimmed independently between the positive polarity deck and negative polarity deck of a deck pair.

In one nonlimiting example, a selected set pulse parameter may be varied and a plurality of target memory cells may be programmed to be set for each value of the selected set pulse parameter. A statistical analysis may be performed relating the portion of memory cells that are actually set, the target memory cells that were programmed to be set and the set pulse parameter values. An optimum value may then be selected and stored in memory controller memory 111. The process may be repeated for each set pulse parameter for the positive polarity deck (i.e., for each positive polarity set pulse parameter) and for each set pulse parameter for the negative polarity deck (i.e., for each negative polarity set pulse parameter).

In operation, the memory controller circuitry 110 may then be configured to identify an address of a target memory cell to be set in response to a write request from processor circuitry 102. The set pulse determination circuitry 116 may then be configured to select a positive polarity set pulse if the target memory cell is included in the positive polarity deck 118 or to select a negative polarity set pulse if the target memory cell is included in the negative polarity deck 119. Selecting the positive polarity set pulse or the negative polarity set pulse may include selecting corresponding set pulse parameter values from memory controller memory 111. The selected set pulse may then be applied to the target memory cell by, e.g., BL control circuitry 114 and WL control circuitry 112.

Thus, a set pulse and corresponding set pulse parameters may be selected for a target memory cell based, at least in part, on whether the target memory cell is included in the positive polarity deck or the negative polarity deck.

Characteristics of a memory cell may change over a cycling lifetime of the memory cell. In other words, set performance may vary over the life of the memory cell. In some embodiments, set pulse determination circuitry 116 may be configured to adjust a selected set pulse parameter based, at least in part, on the cycling lifetime. For example, set pulse determination circuitry 116 may be configured to monitor a number of cycles of a memory cell or a group of memory cells. The number of cycles may then correspond to a cycling lifetime indicator 115. The cycling lifetime indicator 115 for a memory cell or group of memory cells may be stored in memory controller memory 111. The cycling lifetime indicator 115 may then be used to determine when to adjust the selected set pulse parameter.

In one embodiment, each selected set pulse parameter may be adjusted a predefined amount, related to a current cycling lifetime. The predefined amount may be determined a priori based, for example, on historical data from similar memory devices. In another embodiment, trim operations may be repeated to determine new optimum values for each selected set pulse parameter. In both embodiments, the selected set pulse parameter(s) may be adjusted independently for the positive polarity set pulse and the negative polarity set pulse, i.e., per deck.

For example, the nucleation duration may be increased and the growth duration may be decreased for a positive polarity set pulse. In another example, the nucleation duration may be decreased and the growth duration may be increased for a negative polarity set pulse. In both examples, the set pulse duration, Tset, may be maintained constant. In an embodiment, the selected set pulse parameters may be adjusted for the positive polarity set pulse and the negative polarity set pulse. In another embodiment selected set pulse parameters may be adjusted for the negative polarity set pulse.

Thus, an appropriate set pulse may be selected for a target memory cell based, at least in part, on whether the target memory cell is included in the positive polarity deck or the negative polarity deck. One or more set pulse parameter(s) may be adjusted based, at least in part, on a cycling lifetime of one or more memory cells.

Figure 3:
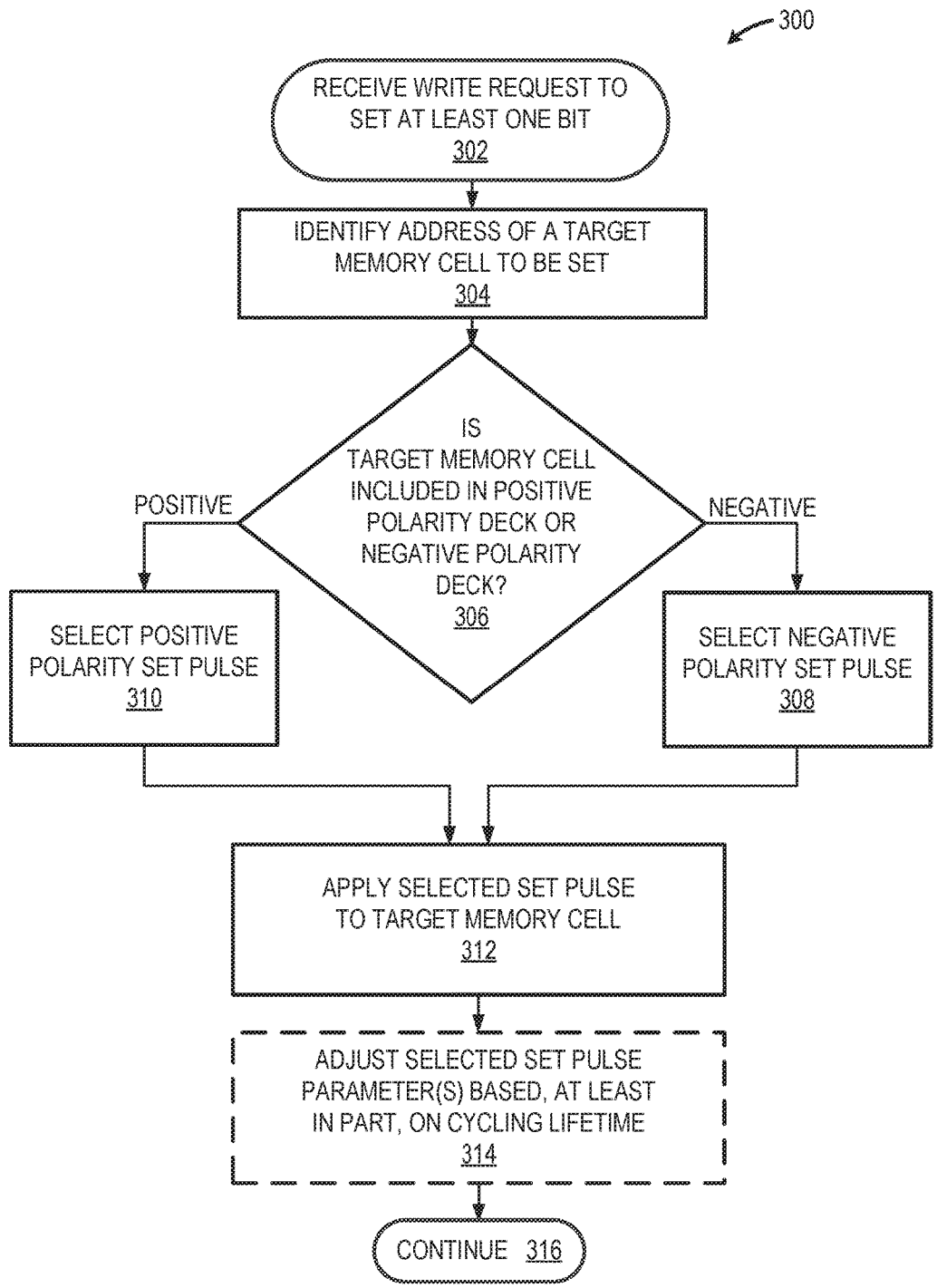
FIG. 3 a flowchart of set pulse selection and programming operations according to various embodiments of the present disclosure.

FIG. 3 is a flowchart 300 of set pulse selection and programming operations according to various embodiments of the present disclosure. In particular, the flowchart 300 illustrates selecting a positive polarity set pulse or a negative polarity set pulse based, at least in part, on whether a target memory cell is included in a positive polarity deck or a negative polarity deck. The operations may be performed, for example, by elements of memory controller 104, e.g., memory controller circuitry 110 and/or set pulse determination circuitry 116, of FIG. 1.

Operations of this embodiment may begin with receiving a write request to set at least one bit at operation 302. Operation 304 includes identifying an address of a target memory cell to be set. Whether the target memory cell is included in a positive polarity deck or a negative polarity deck may be determined at operation 306. If the target memory cell is included in a negative polarity deck, then a negative polarity set pulse may be selected at operation 308. If the target memory cell is included in a positive polarity deck, then a positive polarity set pulse may be selected at operation 310. The selected set pulse may then be applied to the target memory cell at operation 312. In some embodiments, one or more selected set pulse parameter(s) may be adjusted based, at least in part on a cycling lifetime, at operation 314. Program flow may then continue at operation 316.

Thus, a set pulse may be selected based, at least in part, on whether a target memory cell is included in a positive polarity deck or a negative polarity deck. The selected set pulse may then be applied to the target memory cell. In some embodiments, a selected set pulse parameter may be adjusted based, at least in part, on a cycling lifetime.

While the flowchart of FIG. 3 illustrates operations according various embodiments, it is to be understood that not all of the operations depicted in FIG. 3 are necessary for other embodiments. In addition, it is fully contemplated herein that in other embodiments of the present disclosure, the operations depicted in FIG. 3 and/or other operations described herein may be combined in a manner not specifically shown in any of the drawings, and such embodiments may include less or more operations than are illustrated in FIG. 3. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hard-wired circuitry, programmable circuitry such as computer processors comprising one or more individual instruction processing cores, state machine circuitry, logic and/or firmware that stores instructions executed by programmable circuitry. The circuitry may be embodied as an integrated circuit, such as an integrated circuit chip. In some embodiments, the circuitry may be formed, at least in part, by the processor circuitry 102 executing code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface.

The operating system (OS) may be configured to manage system resources and control tasks that are run on, e.g., system 100. For example, the OS may be implemented using Microsoft® Windows®, HP-UX®, Linux®, or UNIX®, although other operating systems may be used. In another example, the OS may be implemented using Android™, iOS, Windows Phone® or BlackBerry®. In some embodiments, the OS may be replaced by a virtual machine monitor (or hypervisor) which may provide a layer of abstraction for underlying hardware to various operating systems (virtual machines) running on one or more processing units. The operating system and/or virtual machine may implement a protocol stack. A protocol stack may execute one or more programs to process packets. An example of a protocol stack is a TCP/IP (Transport Control Protocol/Internet Protocol) protocol stack comprising one or more programs for handling (e.g., processing or generating) packets to transmit and/or receive over a network.

Memory controller memory 111 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

EXAMPLES

Examples of the present disclosure include subject material such as a method, means for performing acts of the method, a device, or of an apparatus or system related to a set technique for phase change memory, as discussed below.

Example 1

According to this example, there is provided a memory controller. The memory controller includes a memory controller circuitry and a set pulse determination circuitry. The memory controller circuitry is to identify an address of a target memory cell to be set. The set pulse determination circuitry is to select a positive polarity set pulse if the target memory cell is included in a positive polarity deck or to select a negative polarity set pulse if the target memory cell is included in a negative polarity deck. Each set pulse includes a respective nucleation portion and a respective growth portion. Each portion has a respective current amplitude and a respective time duration.

Example 2

This example includes the elements of example 1, wherein a nucleation portion duration of the positive polarity set pulse differs from a nucleation portion duration of the negative polarity set pulse and a growth portion duration of the positive polarity set pulse differs from a growth portion duration of the negative polarity set pulse.

Example 3

This example includes the elements of example 1, wherein a nucleation portion duration of the positive polarity set pulse is greater than a nucleation portion duration of the negative polarity set pulse and a growth portion duration of the positive polarity set pulse is less than a growth portion duration of the negative polarity set pulse.

Example 4

This example includes the elements of example 1, wherein at least one of a growth portion current amplitude of the positive polarity set pulse is less than a growth portion current amplitude of the negative polarity set pulse and/or a growth subportion current amplitude of the positive polarity set pulse is less than a growth subportion current amplitude of the negative polarity set pulse.

Example 5

This example includes the elements according to any one of examples 1 through 4, wherein at least one growth portion includes a plurality of growth subportions, each growth subportion having a respective growth subportion current amplitude and a respective growth subportion time duration.

Example 6

This example includes the elements of example 5, wherein the at least one growth portion includes two growth subportions, a first growth subportion current amplitude is greater than a second growth subportion current amplitude and a first growth subportion duration is less than a second growth subportion duration.

Example 7

This example includes the elements according to any one of examples 1 through 4, wherein the set pulse determination circuitry is to determine whether the target memory cell is included in the positive polarity deck or the negative polarity deck.

Example 8

This example includes the elements according to any one of examples 1 through 4, wherein the set pulse determination circuitry is to adjust a selected set pulse parameter based, at least in part, on a cycling lifetime, the adjusting further to maintain a set pulse duration constant.

Example 9

This example includes the elements of example 8, wherein the selected set pulse parameter is selected from the group including a nucleation portion current amplitude of the positive polarity set pulse, a nucleation portion duration of the positive polarity set pulse, a growth portion current amplitude of the positive polarity set pulse, a growth portion duration of the positive polarity set pulse, a growth subportion current amplitude of the positive polarity set pulse, a growth subportion duration of the positive polarity set pulse, a nucleation portion current amplitude of the negative polarity set pulse, a nucleation portion duration of the negative polarity set pulse, a growth portion current amplitude of the negative polarity set pulse, a growth portion duration of the negative polarity set pulse, a growth subportion current amplitude of the negative polarity set pulse and a growth subportion duration of the negative polarity set pulse.

Example 10

This example includes the elements according to any one of examples 1 through 4, wherein the positive polarity set pulse and the negative polarity set pulse have a same time duration, Tset.

Example 11

According to this example, there is provided a method. The method includes identifying, by a memory controller circuitry, an address of a target memory cell to be set; and selecting, by a set pulse determination circuitry, a positive polarity set pulse if the target memory cell is included in a positive polarity deck or a negative polarity set pulse if the target memory cell is included in a negative polarity deck. Each set pulse includes a respective nucleation portion and a respective growth portion. Each portion has a respective current amplitude and a respective time duration.

Example 12

This example includes the elements of example 11, wherein a nucleation portion duration of the positive polarity set pulse differs from a nucleation portion duration of the negative polarity set pulse and a growth portion duration of the positive polarity set pulse differs from a growth portion duration of the negative polarity set pulse.

Example 13

This example includes the elements of example 11, wherein a nucleation portion duration of the positive polarity set pulse is greater than a nucleation portion duration of the negative polarity set pulse and a growth portion duration of the positive polarity set pulse is less than a growth portion duration of the negative polarity set pulse.

Example 14

This example includes the elements of example 11, wherein at least one of a growth portion current amplitude of the positive polarity set pulse is less than a growth portion current amplitude of the negative polarity set pulse and/or a growth subportion current amplitude of the positive polarity set pulse is less than a growth subportion current amplitude of the negative polarity set pulse.

Example 15

This example includes the elements of example 11, wherein at least one growth portion includes a plurality of growth subportions, each growth subportion having a respective growth subportion current amplitude and a respective growth subportion time duration.

Example 16

This example includes the elements of example 15, wherein the at least one growth portion includes two growth subportions, a first growth subportion current amplitude is greater than a second growth subportion current amplitude and a first growth subportion duration is less than a second growth subportion duration.

Example 17

This example includes the elements of example 11, further including determining, by the set pulse determination circuitry, whether the target memory cell is included in the positive polarity deck or the negative polarity deck.

Example 18

This example includes the elements of example 11, further including adjusting, by the set pulse determination circuitry, a selected set pulse parameter based, at least in part, on a cycling lifetime, the adjusting further to maintain a set pulse duration constant.

Example 19

This example includes the elements of example 18, wherein the selected set pulse parameter is selected from the group including a nucleation portion current amplitude of the positive polarity set pulse, a nucleation portion duration of the positive polarity set pulse, a growth portion current amplitude of the positive polarity set pulse, a growth portion duration of the positive polarity set pulse, a growth subportion current amplitude of the positive polarity set pulse, a growth subportion duration of the positive polarity set pulse, a nucleation portion current amplitude of the negative polarity set pulse, a nucleation portion duration of the negative polarity set pulse, a growth portion current amplitude of the negative polarity set pulse, a growth portion duration of the negative polarity set pulse, a growth subportion current amplitude of the negative polarity set pulse and a growth subportion duration of the negative polarity set pulse.

Example 20

This example includes the elements of example 11, wherein the positive polarity set pulse and the negative polarity set pulse have a same time duration, Tset.

Example 21

According to this example, there is provided a system. The system includes a processor circuitry; a memory device and a memory controller. The memory device includes a pair of decks. The pair includes a positive polarity deck and a negative polarity deck. Each deck includes a respective plurality of memory cells. The memory controller includes a memory controller circuitry and a set pulse determination circuitry. The memory controller circuitry is to identify an address of a target memory cell to be set. The set pulse determination circuitry is to select a positive polarity set pulse if the target memory cell is included in the positive polarity deck or to select a negative polarity set pulse if the target memory cell is included in the negative polarity deck. Each set pulse includes a respective nucleation portion and a respective growth portion. Each portion has a respective current amplitude and a respective time duration.

Example 22

This example includes the elements of example 21, wherein a nucleation portion duration of the positive polarity set pulse differs from a nucleation portion duration of the negative polarity set pulse and a growth portion duration of the positive polarity set pulse differs from a growth portion duration of the negative polarity set pulse.

Example 23

This example includes the elements of example 21, wherein a nucleation portion duration of the positive polarity set pulse is greater than a nucleation portion duration of the negative polarity set pulse and a growth portion duration of the positive polarity set pulse is less than a growth portion duration of the negative polarity set pulse.

Example 24

This example includes the elements of example 21, wherein at least one of a growth portion current amplitude of the positive polarity set pulse is less than a growth portion current amplitude of the negative polarity set pulse and/or a growth subportion current amplitude of the positive polarity set pulse is less than a growth subportion current amplitude of the negative polarity set pulse.

Example 25

This example includes the elements according to any one of examples 21 through 24, wherein at least one growth portion includes a plurality of growth subportions, each growth subportion having a respective growth subportion current amplitude and a respective growth subportion time duration.

Example 26

This example includes the elements of example 25, wherein the at least one growth portion includes two growth subportions, a first growth subportion current amplitude is greater than a second growth subportion current amplitude and a first growth subportion duration is less than a second growth subportion duration.

Example 27

This example includes the elements according to any one of examples 21 through 24, wherein the set pulse determination circuitry is to determine whether the target memory cell is included in the positive polarity deck or the negative polarity deck.

Example 28

This example includes the elements according to any one of examples 21 through 24, wherein the set pulse determination circuitry is to adjust a selected set pulse parameter based, at least in part, on a cycling lifetime, the adjusting further to maintain a set pulse duration constant.

Example 29

This example includes the elements of example 28, wherein the selected set pulse parameter is selected from the group including a nucleation portion current amplitude of the positive polarity set pulse, a nucleation portion duration of the positive polarity set pulse, a growth portion current amplitude of the positive polarity set pulse, a growth portion duration of the positive polarity set pulse, a growth subportion current amplitude of the positive polarity set pulse, a growth subportion duration of the positive polarity set pulse, a nucleation portion current amplitude of the negative polarity set pulse, a nucleation portion duration of the negative polarity set pulse, a growth portion current amplitude of the negative polarity set pulse, a growth portion duration of the negative polarity set pulse, a growth subportion current amplitude of the negative polarity set pulse and a growth subportion duration of the negative polarity set pulse.

Example 30

This example includes the elements according to any one of examples 21 through 24, wherein the positive polarity set pulse and the negative polarity set pulse have a same time duration, Tset.

Example 31

According to this example, there is provided a computer readable storage device. The device has stored thereon instructions that when executed by one or more processors result in the following operations including: identifying an address of a target memory cell to be set; and selecting a positive polarity set pulse if the target memory cell is included in a positive polarity deck or a negative polarity set pulse if the target memory cell is included in a negative polarity deck. Each set pulse includes a respective nucleation portion and a respective growth portion. Each portion has a respective current amplitude and a respective time duration.

Example 32

This example includes the elements of example 31, wherein a nucleation portion duration of the positive polarity set pulse differs from a nucleation portion duration of the negative polarity set pulse and a growth portion duration of the positive polarity set pulse differs from a growth portion duration of the negative polarity set pulse.

Example 33

This example includes the elements of example 31, wherein a nucleation portion duration of the positive polarity set pulse is greater than a nucleation portion duration of the negative polarity set pulse and a growth portion duration of the positive polarity set pulse is less than a growth portion duration of the negative polarity set pulse.

Example 34

This example includes the elements of example 31, wherein at least one of a growth portion current amplitude of the positive polarity set pulse is less than a growth portion current amplitude of the negative polarity set pulse and/or a growth subportion current amplitude of the positive polarity set pulse is less than a growth subportion current amplitude of the negative polarity set pulse.

Example 35

This example includes the elements according to any one of examples 31 to 34, wherein at least one growth portion includes a plurality of growth subportions, each growth subportion having a respective growth subportion current amplitude and a respective growth subportion time duration.

Example 36

This example includes the elements of example 35, wherein the at least one growth portion includes two growth subportions, a first growth subportion current amplitude is greater than a second growth subportion current amplitude and a first growth subportion duration is less than a second growth subportion duration.

Example 37

This example includes the elements according to any one of examples 31 through 34, wherein the instructions that when executed by one or more processors results in the following additional operations including determining whether the target memory cell is included in the positive polarity deck or the negative polarity deck.

Example 38

This example includes the elements according to any one of examples 31 through 34, wherein the instructions that when executed by one or more processors results in the following additional operations including adjusting a selected set pulse parameter based, at least in part, on a cycling lifetime, the adjusting further to maintain a set pulse duration constant.

Example 39

This example includes the elements of example 38, wherein the selected set pulse parameter is selected from the group including a nucleation portion current amplitude of the positive polarity set pulse, a nucleation portion duration of the positive polarity set pulse, a growth portion current amplitude of the positive polarity set pulse, a growth portion duration of the positive polarity set pulse, a growth subportion current amplitude of the positive polarity set pulse, a growth subportion duration of the positive polarity set pulse, a nucleation portion current amplitude of the negative polarity set pulse, a nucleation portion duration of the negative polarity set pulse, a growth portion current amplitude of the negative polarity set pulse, a growth portion duration of the negative polarity set pulse, a growth subportion current amplitude of the negative polarity set pulse and a growth subportion duration of the negative polarity set pulse.

Example 40

This example includes the elements according to any one of examples 31 through 34, wherein the positive polarity set pulse and the negative polarity set pulse have a same time duration, Tset.

Example 41

According to this example, there is provided a device. The device includes means for identifying, by a memory controller circuitry, an address of a target memory cell to be set; and means for selecting, by a set pulse determination circuitry, a positive polarity set pulse if the target memory cell is included in a positive polarity deck or a negative polarity set pulse if the target memory cell is included in a negative polarity deck. Each set pulse includes a respective nucleation portion and a respective growth portion. Each portion has a respective current amplitude and a respective time duration.

Example 42

This example includes the elements of example 41, wherein a nucleation portion duration of the positive polarity set pulse differs from a nucleation portion duration of the negative polarity set pulse and a growth portion duration of the positive polarity set pulse differs from a growth portion duration of the negative polarity set pulse.

Example 43

This example includes the elements of example 41, wherein a nucleation portion duration of the positive polarity set pulse is greater than a nucleation portion duration of the negative polarity set pulse and a growth portion duration of the positive polarity set pulse is less than a growth portion duration of the negative polarity set pulse.

Example 44

This example includes the elements of example 41, wherein at least one of a growth portion current amplitude of the positive polarity set pulse is less than a growth portion current amplitude of the negative polarity set pulse and/or a growth subportion current amplitude of the positive polarity set pulse is less than a growth subportion current amplitude of the negative polarity set pulse.

Example 45

This example includes the elements according to any one of examples 41 through 44, wherein at least one growth portion includes a plurality of growth subportions, each growth subportion having a respective growth subportion current amplitude and a respective growth subportion time duration.

Example 46

This example includes the elements of example 45, wherein the at least one growth portion includes two growth subportions, a first growth subportion current amplitude is greater than a second growth subportion current amplitude and a first growth subportion duration is less than a second growth subportion duration.

Example 47

This example includes the elements according to any one of examples 41 through 44, further including means for determining, by the set pulse determination circuitry, whether the target memory cell is included in the positive polarity deck or the negative polarity deck.

Example 48

This example includes the elements according to any one of examples 41 through 44, further including means for adjusting, by the set pulse determination circuitry, a selected set pulse parameter based, at least in part, on a cycling lifetime, the adjusting further to maintain a set pulse duration constant.

Example 49

This example includes the elements of example 48, wherein the selected set pulse parameter is selected from the group including a nucleation portion current amplitude of the positive polarity set pulse, a nucleation portion duration of the positive polarity set pulse, a growth portion current amplitude of the positive polarity set pulse, a growth portion duration of the positive polarity set pulse, a growth subportion current amplitude of the positive polarity set pulse, a growth subportion duration of the positive polarity set pulse, a nucleation portion current amplitude of the negative polarity set pulse, a nucleation portion duration of the negative polarity set pulse, a growth portion current amplitude of the negative polarity set pulse, a growth portion duration of the negative polarity set pulse, a growth subportion current amplitude of the negative polarity set pulse and a growth subportion duration of the negative polarity set pulse.

Example 50

This example includes the elements according to any one of examples 41 through 44, wherein the positive polarity set pulse and the negative polarity set pulse have a same time duration, Tset.

Example 51

According to this example, there is provided a system. The system includes at least one device arranged to perform the method of any one of examples 11 to 20.

Example 52

According to this example, there is provided a device. The device includes means to perform the method of any one of examples 11 to 20.

Example 53

According to this example, there is provided a computer readable storage device. The device has stored thereon instructions that when executed by one or more processors result in the following operations including: the method according to any one of examples 11 to 20.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A memory controller comprising:
    a memory controller circuitry to identify an address of a target memory cell to be set; and
    a set pulse determination circuitry to select a positive polarity set pulse if the target memory cell is included in a positive polarity deck or to select a negative polarity set pulse if the target memory cell is included in a negative polarity deck,
    each set pulse comprising a respective nucleation portion and a respective growth portion, each portion having a respective current amplitude and a respective time duration.

2. The memory controller of claim 1, wherein a nucleation portion duration of the positive polarity set pulse differs from a nucleation portion duration of the negative polarity set pulse and a growth portion duration of the positive polarity set pulse differs from a growth portion duration of the negative polarity set pulse.

3. The memory controller of claim 1, wherein a nucleation portion duration of the positive polarity set pulse is greater than a nucleation portion duration of the negative polarity set pulse and a growth portion duration of the positive polarity set pulse is less than a growth portion duration of the negative polarity set pulse.

4. The memory controller of claim 1, wherein at least one of a growth portion current amplitude of the positive polarity set pulse is less than a growth portion current amplitude of the negative polarity set pulse and/or a growth subportion current amplitude of the positive polarity set pulse is less than a growth subportion current amplitude of the negative polarity set pulse.

5. The memory controller of claim 1, wherein at least one respective growth portion comprises two growth subportions, a first growth subportion current amplitude is greater than a second growth subportion current amplitude and a first growth subportion duration is less than a second growth subportion duration.

6. The memory controller of claim 1, wherein the set pulse determination circuitry is to determine whether the target memory cell is included in the positive polarity deck or the negative polarity deck.

7. The memory controller of claim 1, wherein the set pulse determination circuitry is to adjust a selected set pulse parameter based, at least in part, on a cycling lifetime, the adjusting further to maintain a set pulse duration constant and the selected set pulse parameter is selected from a group comprising a nucleation portion current amplitude of the positive polarity set pulse, a nucleation portion duration of the positive polarity set pulse, a growth portion current amplitude of the positive polarity set pulse, a growth portion duration of the positive polarity set pulse, a growth subportion current amplitude of the positive polarity set pulse, a growth subportion duration of the positive polarity set pulse, a nucleation portion current amplitude of the negative polarity set pulse, a nucleation portion duration of the negative polarity set pulse, a growth portion current amplitude of the negative polarity set pulse, a growth portion duration of the negative polarity set pulse, a growth subportion current amplitude of the negative polarity set pulse and a growth subportion duration of the negative polarity set pulse.

8. The memory controller of claim 1, wherein the positive polarity set pulse and the negative polarity set pulse have a same time duration, Tset.

9. A method comprising:
    identifying, by a memory controller circuitry, an address of a target memory cell to be set; and
    selecting, by a set pulse determination circuitry, a positive polarity set pulse if the target memory cell is included in a positive polarity deck or a negative polarity set pulse if the target memory cell is included in a negative polarity deck,
    each set pulse comprising a respective nucleation portion and a respective growth portion, each portion having a respective current amplitude and a respective time duration.

10. The method of claim 9, wherein a nucleation portion duration of the positive polarity set pulse differs from a nucleation portion duration of the negative polarity set pulse and a growth portion duration of the positive polarity set pulse differs from a growth portion duration of the negative polarity set pulse.

11. The method of claim 9, wherein a nucleation portion duration of the positive polarity set pulse is greater than a nucleation portion duration of the negative polarity set pulse and a growth portion duration of the positive polarity set pulse is less than a growth portion duration of the negative polarity set pulse.

12. The method of claim 9, wherein at least one of a growth portion current amplitude of the positive polarity set pulse is less than a growth portion current amplitude of the negative polarity set pulse and/or a growth subportion current amplitude of the positive polarity set pulse is less than a growth subportion current amplitude of the negative polarity set pulse.

13. The method of claim 9, wherein at least one respective growth portion comprises two growth subportions, a first growth subportion current amplitude is greater than a second growth subportion current amplitude and a first growth subportion duration is less than a second growth subportion duration.

14. The method of claim 9, further comprising determining, by the set pulse determination circuitry, whether the target memory cell is included in the positive polarity deck or the negative polarity deck.

15. The method of claim 9, further comprising adjusting, by the set pulse determination circuitry, a selected set pulse parameter based, at least in part, on a cycling lifetime, the adjusting further to maintain a set pulse duration constant, wherein the selected set pulse parameter is selected from a group comprising a nucleation portion current amplitude of the positive polarity set pulse, a nucleation portion duration of the positive polarity set pulse, a growth portion current amplitude of the positive polarity set pulse, a growth portion duration of the positive polarity set pulse, a growth subportion current amplitude of the positive polarity set pulse, a growth subportion duration of the positive polarity set pulse, a nucleation portion current amplitude of the negative polarity set pulse, a nucleation portion duration of the negative polarity set pulse, a growth portion current amplitude of the negative polarity set pulse, a growth portion duration of the negative polarity set pulse, a growth subportion current amplitude of the negative polarity set pulse and a growth subportion duration of the negative polarity set pulse.

16. The method of claim 9, wherein the positive polarity set pulse and the negative polarity set pulse have a same time duration, Tset.

17. A system comprising:
    a processor circuitry;
    a memory device comprising a pair of decks, the pair comprising a positive polarity deck and a negative polarity deck, each deck comprising a respective plurality of memory cells; and a memory controller comprising:
- a memory controller circuitry to identify an address of a target memory cell to be set, and
- a set pulse determination circuitry to select a positive polarity set pulse if the target memory cell is included in the positive polarity deck or to select a negative polarity set pulse if the target memory cell is included in the negative polarity deck,
- each set pulse comprising a respective nucleation portion and a respective growth portion, each portion having a respective current amplitude and a respective time duration.

18. The system of claim 17, wherein a nucleation portion duration of the positive polarity set pulse differs from a nucleation portion duration of the negative polarity set pulse and a growth portion duration of the positive polarity set pulse differs from a growth portion duration of the negative polarity set pulse.

19. The system of claim 17, wherein a nucleation portion duration of the positive polarity set pulse is greater than a nucleation portion duration of the negative polarity set pulse and a growth portion duration of the positive polarity set pulse is less than a growth portion duration of the negative polarity set pulse.

20. The system of claim 17, wherein at least one of a growth portion current amplitude of the positive polarity set pulse is less than a growth portion current amplitude of the negative polarity set pulse and/or a growth subportion current amplitude of the positive polarity set pulse is less than a growth subportion current amplitude of the negative polarity set pulse.

21. The system of claim 17, wherein at least one respective growth portion comprises two growth subportions, a first growth subportion current amplitude is greater than a second growth subportion current amplitude and a first growth subportion duration is less than a second growth subportion duration.

22. The system of claim 17, wherein the set pulse determination circuitry is to determine whether the target memory cell is included in the positive polarity deck or the negative polarity deck.

23. The system of claim 17, wherein the set pulse determination circuitry is to adjust a selected set pulse parameter based, at least in part, on a cycling lifetime, the adjusting further to maintain a set pulse duration constant and the selected set pulse parameter is selected from a group comprising a nucleation portion current amplitude of the positive polarity set pulse, a nucleation portion duration of the positive polarity set pulse, a growth portion current amplitude of the positive polarity set pulse, a growth portion duration of the positive polarity set pulse, a growth subportion current amplitude of the positive polarity set pulse, a growth subportion duration of the positive polarity set pulse, a nucleation portion current amplitude of the negative polarity set pulse, a nucleation portion duration of the negative polarity set pulse, a growth portion current amplitude of the negative polarity set pulse, a growth portion duration of the negative polarity set pulse, a growth subportion current amplitude of the negative polarity set pulse and a growth subportion duration of the negative polarity set pulse.

24. The system of claim 17, wherein the positive polarity set pulse and the negative polarity set pulse have a same time duration, Tset.

* * * * *